US008698763B2

(12) United States Patent
Kim et al.

(10) Patent No.: US 8,698,763 B2
(45) Date of Patent: Apr. 15, 2014

(54) TOUCH PANEL

(75) Inventors: Woon Chun Kim, Gyunggi-do (KR); Yong Soo Oh, Gyunggi-do (KR); Jong Young Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 832 days.

(21) Appl. No.: 12/823,751

(22) Filed: Jun. 25, 2010

(65) Prior Publication Data

US 2011/0247884 A1 Oct. 13, 2011

(30) Foreign Application Priority Data

Apr. 12, 2010 (KR) ........................ 10-2010-0033477

(51) Int. Cl.
*G06F 3/041* (2006.01)
(52) U.S. Cl.
USPC ...................... 345/173; 178/18.01; 178/18.06
(58) Field of Classification Search
None
See application file for complete search history.

(56) References Cited

U.S. PATENT DOCUMENTS

| 2006/0207806 | A1* | 9/2006 | Philipp ....................... 178/18.05 |
| 2007/0074914 | A1* | 4/2007 | Geaghan et al. ........... 178/18.06 |
| 2008/0218487 | A1* | 9/2008 | Huang et al. ................... 345/173 |
| 2010/0007624 | A1* | 1/2010 | Jiang et al. ...................... 345/173 |
| 2010/0265210 | A1* | 10/2010 | Nakanishi et al. ............. 345/174 |
| 2011/0050624 | A1* | 3/2011 | Lee et al. ........................ 345/174 |
| 2011/0096015 | A1* | 4/2011 | Yilmaz .......................... 345/174 |
| 2011/0234530 | A1* | 9/2011 | Kim et al. ...................... 345/174 |

FOREIGN PATENT DOCUMENTS

| JP | 04-128330 | 4/1992 |
| JP | 2008-217784 | 9/2008 |

OTHER PUBLICATIONS

Office Action from counterpart Korean Patent Application No. 10-2010-0033477, mailed May 31, 2011, 3 pages.

* cited by examiner

*Primary Examiner* — Adam R Giesy
(74) *Attorney, Agent, or Firm* — Bracewell & Giuliani LLP; Brad Y. Chin

(57) ABSTRACT

Disclosed herein is a touch panel 100 including: bar type transparent electrodes 120 that are formed on a transparent substrate 110, bar type opening parts 130 that are formed in the bar type transparent electrodes 120 so as to be surrounded by the bar type transparent electrodes 120, and wirings 140 of which one ends are connected to the bar type transparent electrodes 120 and the other ends are collected at one side of the transparent substrate 110. The touch panel 100 includes the bar type transparent electrodes 120 in which the bar type opening parts 130 are formed and subdivides the transparent electrodes, thereby making it possible to improve touch sensitivity without increasing the wirings 140 and improve transparency.

4 Claims, 6 Drawing Sheets

TOUCH PANEL

CROSS REFERENCE TO RELATED APPLICATION

This application claims the benefit of Korean Patent Application No. 10-2010-0033477, filed on Apr. 12, 2010, entitled "Touch Panel", which is hereby incorporated by reference in its entirety into this application.

TECHNICAL FIELD

The present invention relates to a touch panel.

DESCRIPTION OF THE RELATED ART

Alongside the growth of computers using digital technology, devices assisting the computers have also been developed, and personal computers, portable transmitters and other personal information processors execute processing of text and graphics using a variety of input devices such as a keyboard, a mouse and so on.

While the rapid advancement of the information-based society has been widening the use of computers more and more, there have been occurring the problems of it being difficult to efficiently operate products using only the keyboard and mouse as being responsible for the input device function. Thus, the demand for a device which is simple, does not malfunction, and has the capability to input easily is increasing.

Furthermore, current techniques for input devices exceed the level of fulfilling general functions and thus are progressing towards techniques related to high reliability, durability, innovation, designing and manufacturing. To this end, a touch panel has been developed as an input device capable of inputting information such as text and graphics.

The touch panel is mounted on the display surface of an image display device such as an electronic organizer, a flat panel display including a liquid crystal display (LCD), a plasma display panel (PDP), an electroluminescence (El) element or the like, or a cathode ray tube (CRT), so that a user selects the information desired while viewing the image display device.

The touch panel is classifiable as a resistive type, a capacitive type, an electromagnetic type, a surface acoustic wave (SAW) type, and an infrared type. The type of touch panel selected is one that is adapted for an electronic product in consideration of not only signal amplification problems, resolution differences and the degree of difficulty of designing and manufacturing technology but also in light of optical properties, electrical properties, mechanical properties, resistance to the environment, input properties, durability and economic benefits of the touch panel. In particular, resistive and capacitive types are prevalently used.

FIG. 1 is a perspective view of a touch panel according to the prior art. Problems of the prior art will be described with reference to FIG. 1.

As shown in FIG. 1, the touch panel 10 according to the prior art includes transparent electrodes 30 that are formed on one surface of a transparent substrate 20, and wirings 40 that are extended from the transparent electrodes 30 to be collected at one side of the transparent substrate 20. Herein, the transparent electrode 30 serves to recognize the change in resistance values or capacitive values. The transparent electrode 30 is indispensable for sensing a user's touch. However, it is actually impossible to manufacture the transparent electrode 30 with 100% transparency. Therefore, the transparency of the touch panel 10 is degraded due to the transparent electrodes 30, having difficulty in distinguishing images output from a display panel. In the case of some users, the transparent electrodes 30 are distinguished by the naked eyes, which is inconvenient to a user using the touch panel 10.

SUMMARY OF THE INVENTION

The present invention has been made in an effort to provide a touch panel that forms opening parts in transparent electrodes to improve transparency and allow the transparent electrodes not to be distinguished by a user's naked eyes.

A touch panel according to a first preferred embodiment of the present invention includes: bar type transparent electrodes that are formed on a transparent substrate; bar type opening parts that are formed in the bar type transparent electrodes so as to be surrounded by the bar type transparent electrodes; and wirings of which one ends are connected to the bar type transparent electrodes and the other ends are collected at one side of the transparent substrate.

Herein, two or more bar type opening parts are formed in the bar type transparent electrodes.

Further, two or more bar type opening parts are formed along the longitudinal direction of the bar type transparent electrodes.

Further, two or more bar type opening parts are formed along the thickness direction of the bar type transparent electrodes.

Further, the bar type transparent electrode in which the bar type opening part is formed has a constant width.

Further, the bar type transparent electrode in which the bar type opening part is formed has a width below 60 μm.

A touch panel according to a second preferred embodiment of the present invention includes: bar type transparent electrodes that are formed on a transparent substrate; bar type opening parts that are formed in the bar type transparent electrodes so as to open one ends of the bar type transparent electrodes; and wirings of which one ends are connected to the bar type transparent electrodes and the other ends are collected at one side of the transparent substrate.

Herein, two or more bar type opening parts are formed along the thickness direction of the bar type transparent electrodes.

Further, the bar type transparent electrode in which the bar type opening part is formed has a constant width.

Further, the bar type transparent electrode in which the bar type opening part is formed has a width below 60 μm.

DESCRIPTION OF THE PREFERRED EMBODIMENTS

Figure 1:
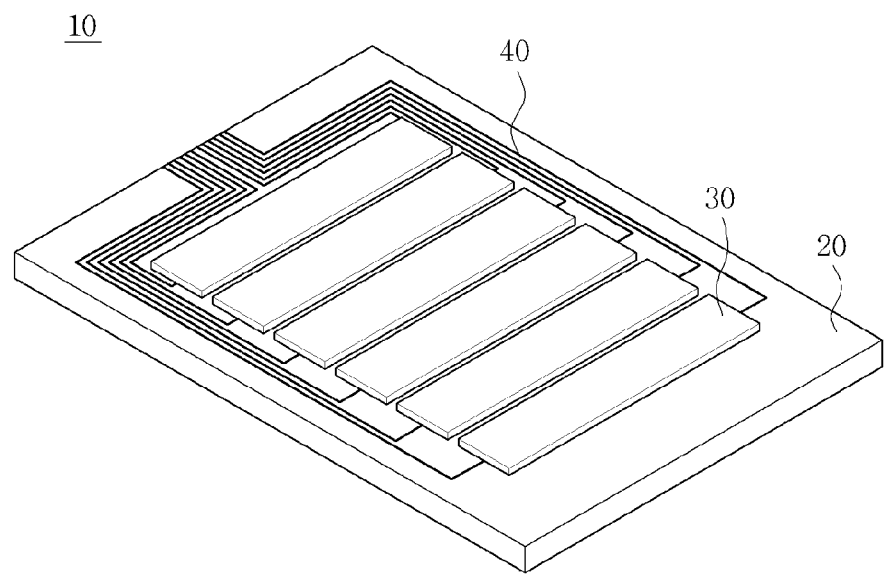
FIG. 1 is a perspective view of a touch panel according to the prior art.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, in describing the present invention, a detailed description of related known functions or configurations will be omitted so as not to obscure the gist of the present invention.

Hereinafter, preferred embodiments of the present invention will be described in detail with reference to the accompanying drawings.

Figure 2:
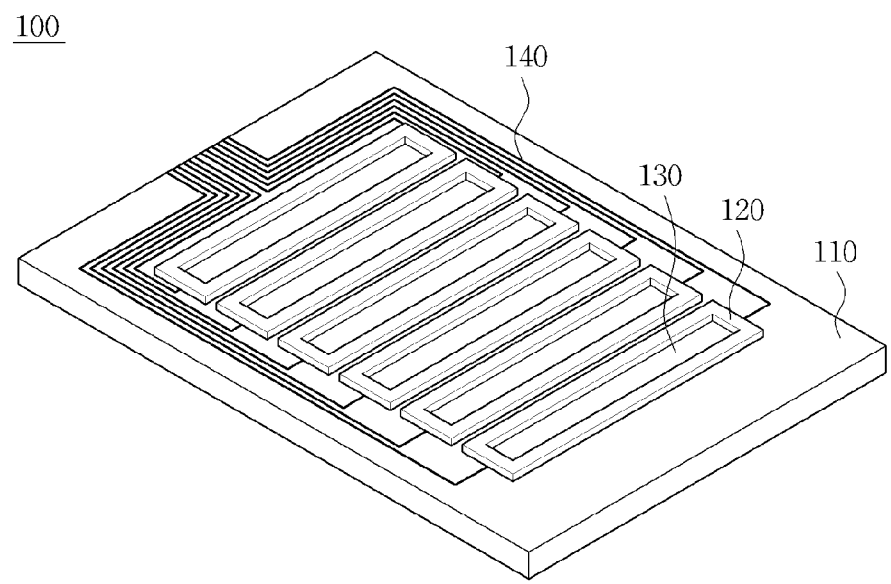
FIGS. 2 to 6 are perspective views of a touch panel according to a first preferred embodiment of the present invention.
Figure 3:
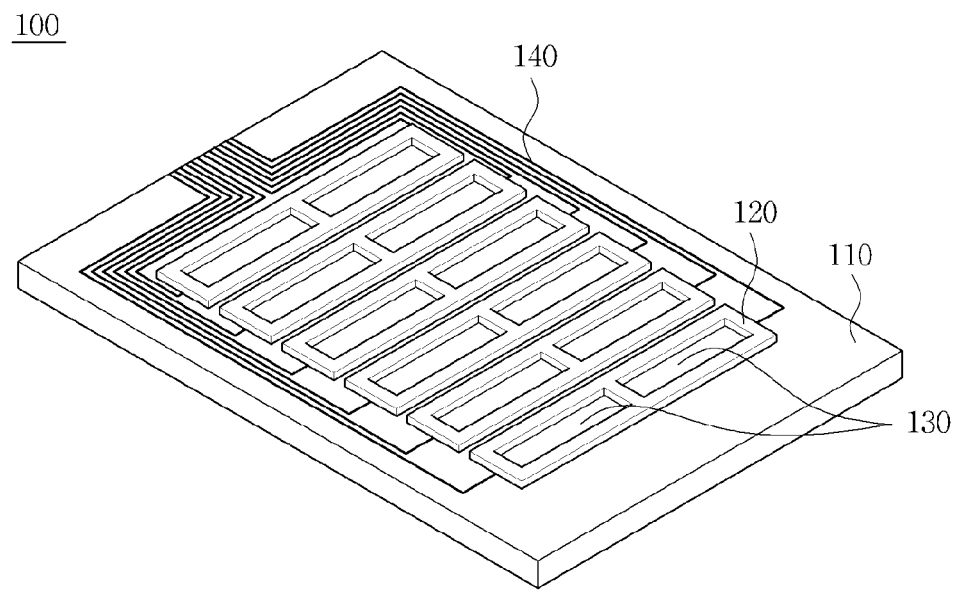
Figure 4:
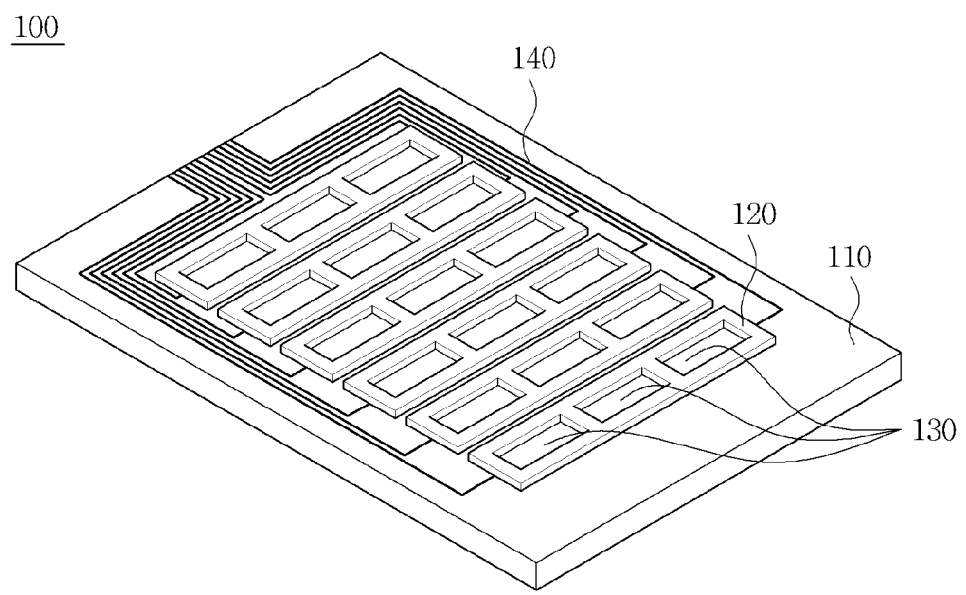
Figure 5:
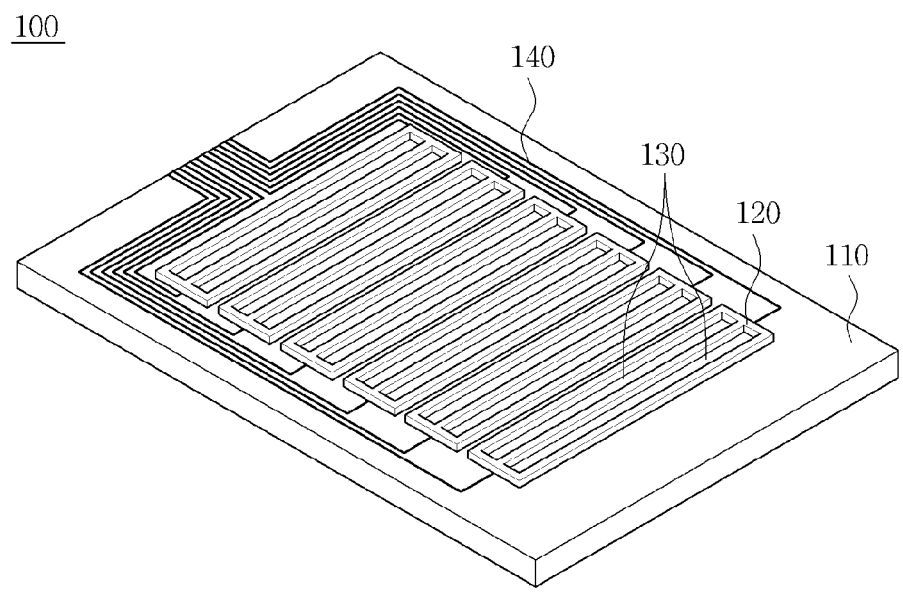
Figure 6:
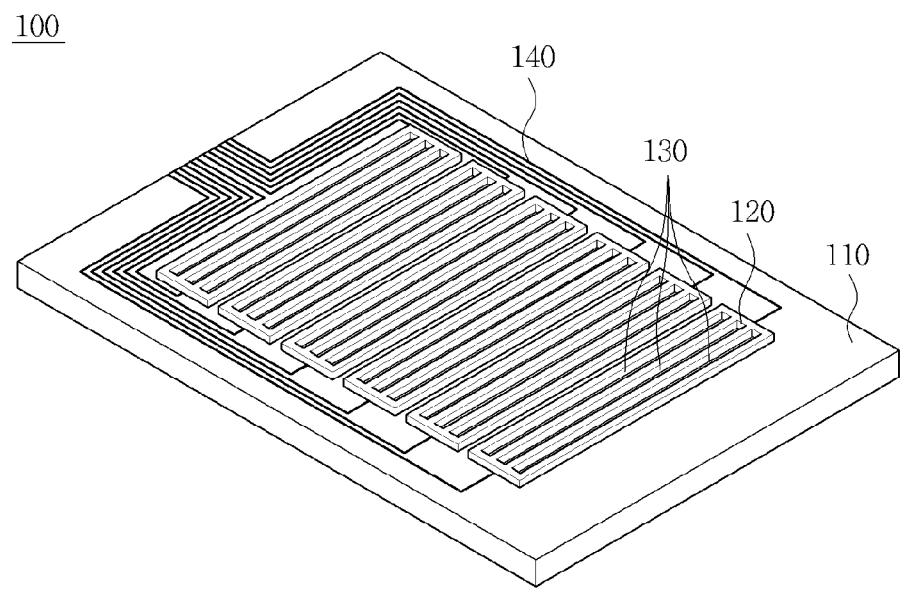
Figure 7:
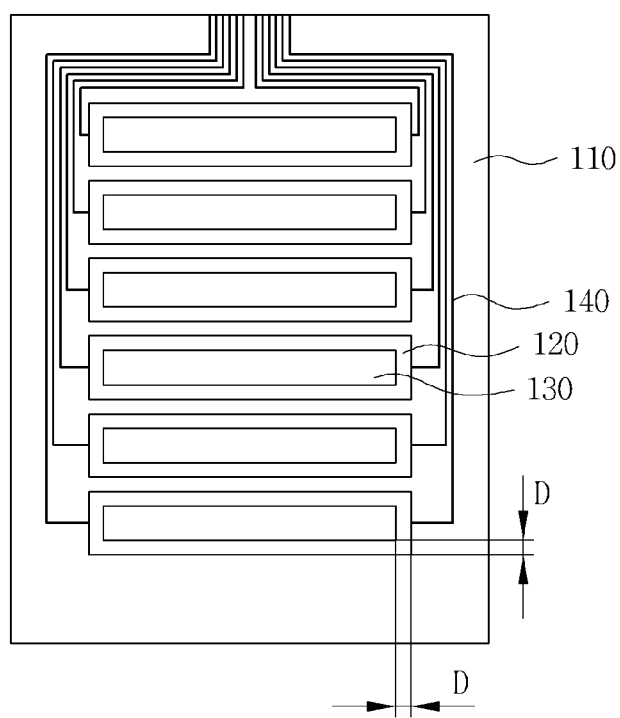
FIG. 7 is a plan view of the touch panel of FIG. 2.

FIGS. 2 to 6 are perspective views of a touch panel according to a first preferred embodiment of the present invention, and FIG. 7 is a plan view of the touch panel of FIG. 2.

As shown in FIGS. 2 to 7, the touch panel 100 according to the present embodiment includes bar type transparent electrodes 120 that are formed on a transparent substrate 110, bar type opening parts 130 that are formed in the bar type transparent electrodes 120 so as to be surrounded by the bar type transparent electrodes 120, and wirings 140 of which one ends are connected to the bar type transparent electrodes 120 and the other ends are collected at one side of the transparent substrate 110.

The transparent substrate 110 includes the bar type transparent electrodes 120 and the wirings 140 formed on one surface thereof. The transparent substrate 110 has various mechanical strength or flexibility depending on the type of the touch panel 100. Herein, the material of the transparent substrate 110 is not particularly limited, and may include polyethyleneterephthalate (PET), polycarbonate (PC), polymethylmethacrylate (PMMA), polyethylenenaphthalate (PEN), polyethersulfone (PES), cyclic olefin copolymer (COC), triacetylcellulose (TAC) film, polyvinyl alcohol (PVA) film, polyimide (PI) film, polystyrene (PS), biaxially oriented polystyrene (BOPS; containing K resin), glass or reinforced glass and so on. Meanwhile, it is preferable that a high frequency process or a primer process is performed on the transparent substrate 110 in order to activate the surface thereof (improve adhesion) before forming the bar type transparent electrodes 120 on the transparent substrate 110.

The bar type transparent electrode 120 serves to generate signals when a user touches it and allow a controller to recognize touched coordinates. The bar type transparent electrode 120 is formed on one surface of the transparent substrate 110. Herein, the material of the bar type transparent electrode 120 is not particularly limited, but may include a conductive polymer having excellent flexibility and a simple coating process or indium tin oxide (ITO). At this time, the conductive polymer includes poly-3,4-ethylenedioxythiophene/polystyrenesulfonate (PEDOT/PSS), polyaniline, polyacetylene, polyphenylenevinylene, or the like.

Further, bar type opening parts 130 are formed in the bar type transparent electrodes 120. Herein, the bar type opening part 130 is disposed inside the bar type transparent electrode 120 so as to be surrounded by the bar type transparent electrode 120. The bar type opening parts 130 are formed in the bar type transparent electrodes 120, such that the bar type transparent electrodes 120 are subdivided, thereby making it possible to improve touch sensitivity without increasing the wirings 140, and an area on which the bar type transparent electrodes 120 are formed is reduced, thereby making it possible to improve transparency of the touch panel 100. In addition, different from the transparent electrodes according to the prior art that can be distinguished by a user's naked eye, the bar type transparent electrodes 120 according to the present invention are not distinguished by a user's naked eye, thereby making it possible to reduce an inconvenience to the user when using the touch panel 100.

Meanwhile, two or more bar type opening parts 130 may be formed in one bar type transparent electrode 120, wherein the bar type opening part 130 may be formed in various structures. For example, two bar type opening parts 130 may be formed along the longitudinal direction of the bar type transparent electrode 120 (see FIG. 3) or three bar type opening parts 130 may be formed along the longitudinal direction of the bar type transparent electrode 120 (see FIG. 4). Alternatively, two bar type opening parts 130 may be formed along the thickness direction of the bar type transparent electrode 120 (see FIG. 5) or three bar type opening parts 130 may be formed along the thickness direction of the bar type transparent electrode 120 (see FIG. 6). Although one to three bar type opening parts 130 are shown in the drawings, the scope of the present invention is not limited thereto but four or more bar type opening parts 130 may also be formed in the same structure.

In addition, it is preferable that the width D of the bar type transparent electrode 120 remains constant in order to maintain constant resistance values of the bar type transparent electrode 120 (see FIG. 7). At this time, in order to prevent the bar type transparent electrode 120 from being distinguished by the user's naked eyes, the width D of the bar type transparent electrode 120 may be formed below 60 μm, but is not limited thereto.

The wirings 140 are connected to the bar type transparent electrodes 120 to receive the electrical signals of the bar type transparent electrodes 120 and to transfer the electrical signals to the controller. Herein, one ends of the wirings 140 are connected to the bar type transparent electrodes 120 and the other ends thereof are collected at one side of the transparent electrode 110. At this time, the wirings 140 may be printed using a silk screen method, a gravure printing method, an ink-jet printing method or the like. Further, the wiring 140 may be made of silver (Ag) paste or organic Ag having superior electrical conductivity, but the present invention is not limited thereto. In addition, a conductive polymer material, carbon black (including carbon nanotubes), or a low resistive metal including metal or a metal oxide such as ITO may be used.

Meanwhile, although the wirings 140 are shown to be connected to both ends of the bar type transparent electrodes 120 by way of example, they may also be connected to only one ends of the bar type transparent electrodes 120 depending on the type of the touch panel.

The touch panel 100 according to the present invention has a structure in which the bar type transparent electrodes 120 are formed in a single layer, such that it may be used as a self capacitive type touch panel. Further, two touch panels 100 are bonded to each other using a double-sided adhesive or the like so that the bar type transparent electrodes 120 are opposite to each other, such that it may be used as a mutual capacitive touch panel or a resistive touch panel.

Figure 8:
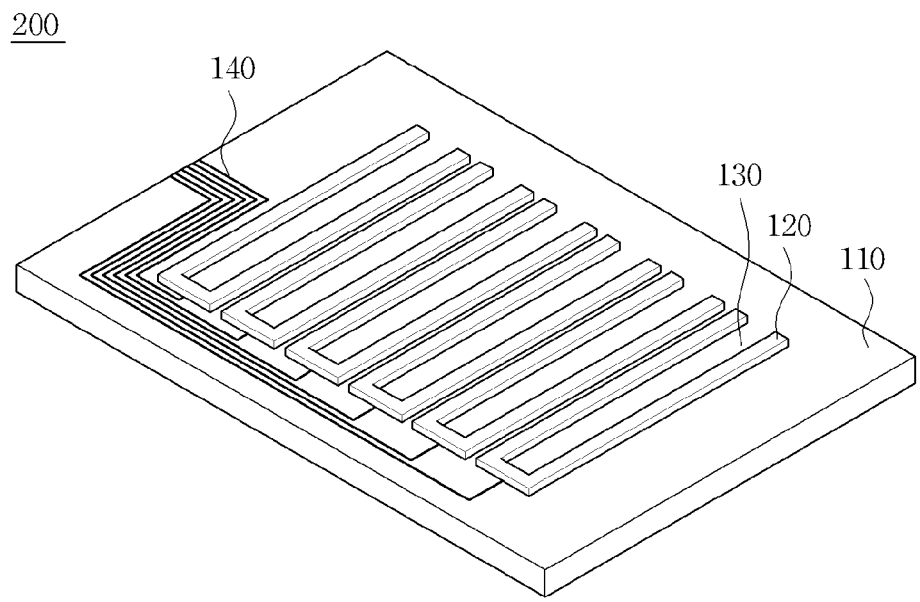
FIGS. 8 to 9 are perspective views of a touch panel according to a second preferred embodiment of the present invention.
Figure 9:
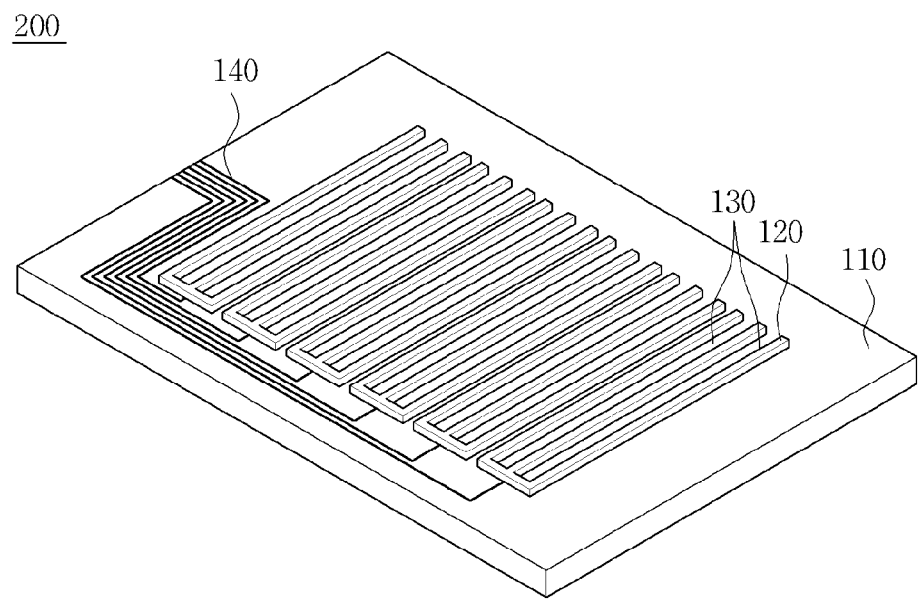
Figure 10:
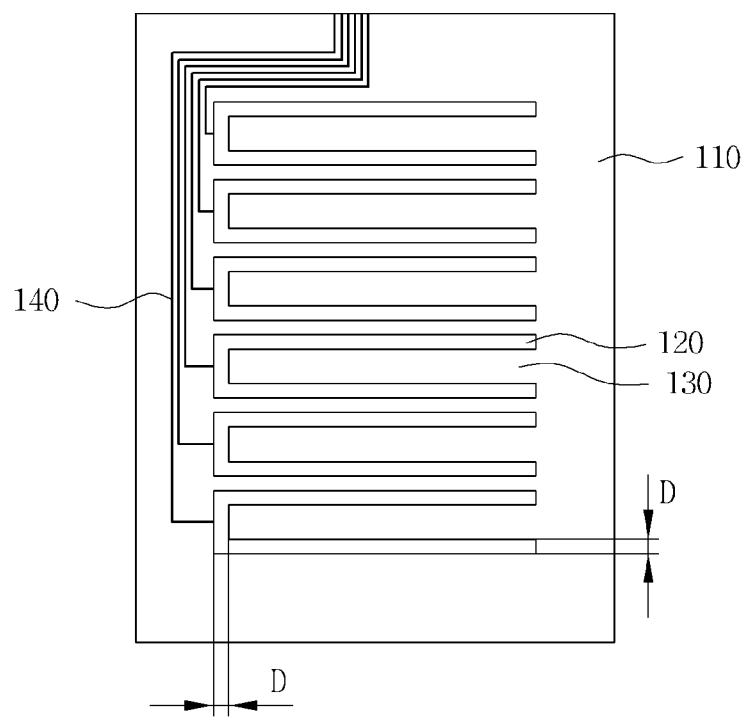
FIG. 10 is a plan view of the touch panel of FIG. 8.

FIGS. 8 to 9 are perspective views of a touch panel according to a second preferred embodiment of the present invention, and FIG. 10 is a plan view of the touch panel of FIG. 8.

As shown in FIGS. 8 to 10, the most significant difference between the touch panel 200 according to the present embodiment and the touch panel 100 according to the first embodiment is a position in which the bar type opening parts 130 are formed. Therefore, the present embodiment will be described focusing on the bar type opening parts 130. The configuration except for the bar type opening parts 130 is the same as that of the touch panel 100 according to the first embodiment and therefore, the description thereof will be omitted.

The bar type opening parts 130 according to the first embodiment are formed inside the bar type transparent electrodes 120 so as to be surrounded by the bar type transparent electrodes 120. In contrast, the bar type opening parts 130 according to the present embodiment are formed in the bar type transparent electrode 120 so as to open one ends of the bar type transparent electrodes 120, such that the bar type transparent electrodes 120 are formed in a '⊏' shape (see FIG. 8). Meanwhile, two bar type opening parts 130 may be formed along the thickness direction of the bar type transparent electrode 120. In this case, the bar type transparent electrodes 120 are formed in a '⊨' shape (see FIG. 9). Although one or two bar type opening parts 130 are shown in the drawings, the scope of the present invention is not limited thereto but three or more bar type opening parts 130 may also be formed in the same structure.

In addition, in the same manner as the first embodiment, it is preferable that the width D of the bar type transparent electrode 120 remains constant in order to maintain constant resistance values of the bar type transparent electrode 120 (see FIG. 10). At this time, in order to prevent the bar type transparent electrodes 120 from being distinguished by the user's naked eyes, the width D of the bar type transparent electrode 120 may be formed below 60 μm, but is not limited thereto.

According to the present invention, the touch panel includes the transparent electrodes in which the opening parts are formed and subdivides the transparent electrodes, thereby making it possible to improve touch sensitivity without increasing the wirings and improve transparency.

Further, according to the present invention, the opening parts are formed in the transparent electrodes, thereby making it possible to allow the transparent electrodes not to be distinguished by a user's naked eyes.

Although the embodiment of the present invention has been disclosed for illustrative purposes, it will be appreciated that a touch panel according to the invention is not limited thereby, and those skilled in the art will appreciate that various modifications, additions and substitutions are possible, without departing from the scope and spirit of the invention. Accordingly, any and all modifications, variations or equivalent arrangements should be considered to be within the scope of the invention, and the detailed scope of the invention will be disclosed by the accompanying claims.

What is claimed is:

1. A touch panel, comprising:

bar type transparent electrodes that are formed on a transparent substrate;

bar type opening parts that are formed in the bar type transparent electrodes so as to be surrounded by the bar type transparent electrodes; and wirings of which one ends are connected to the bar type transparent electrodes an other ends are collected at one side of the transparent substrate, wherein two or more bar type opening parts are formed along the width direction of a bar type transparent electrode of the bar type transparent electrodes, and wherein the bar type transparent electrodes in which the bar type opening parts are formed have a line width below 60 μm.

2. A touch panel, comprising:

bar type transparent electrodes that are formed on a transparent substrate;

bar type opening parts that are formed in the bar type transparent electrodes so as to open one ends of the bar type transparent electrodes; and wirings of which one ends are connected to the bar type transparent electrodes and the other ends are collected at one side of the transparent substrate, wherein two or more bar type opening parts are formed along the width direction of a bar type transparent electrode of the bar type transparent electrodes.

3. The touch panel as set forth in claim 2, wherein the bar type transparent electrodes in which the bar type opening parts are formed have a constant line width.

4. The touch panel as set forth in claim 2, wherein the bar type transparent electrodes in which the bar type opening parts are formed have a line width below 60 μm.

* * * * *